United States Patent
Jeun et al.

(10) Patent No.: US 7,208,819 B2
(45) Date of Patent: Apr. 24, 2007

(54) POWER MODULE PACKAGE HAVING IMPROVED HEAT DISSIPATING CAPABILITY

(75) Inventors: Gi-young Jeun, Kyungki-do (KR); Sung-min Park, Seoul (KR); Joo-sang Lee, Seoul (KR); Sung-won Lim, Kyungki-do (KR); O-seob Jeon, Seoul (KR); Byoung-ok Lee, Kyungki-do (KR); Young-gil Kim, Seoul (KR); Gwi-gyeon Yang, Kyungki-do (KR)

(73) Assignee: Fairchild Korea Semiconductor Ltd. (KR)

( * ) Notice: Subject to any disclaimer, the term of this patent is extended or adjusted under 35 U.S.C. 154(b) by 218 days.

(21) Appl. No.: 10/974,357

(22) Filed: Oct. 26, 2004

(65) Prior Publication Data

US 2005/0056918 A1 Mar. 17, 2005

Related U.S. Application Data

(62) Division of application No. 10/167,067, filed on Jun. 10, 2002, now Pat. No. 7,061,080.

(30) Foreign Application Priority Data

Jun. 11, 2001 (KR) .............................. 2001-32489
Apr. 17, 2002 (KR) .............................. 2002-20779

(51) Int. Cl.
  *H01L 23/495* (2006.01)
(52) U.S. Cl. ........................... 257/666; 257/676
(58) Field of Classification Search ................ 257/676, 257/666

See application file for complete search history.

(56) References Cited

U.S. PATENT DOCUMENTS

| 5,315,153 | A | 5/1994 | Nagai et al. |
| 5,519,252 | A | 5/1996 | Soyano et al. |
| 5,703,399 | A | 12/1997 | Majumdar et al. |
| 5,710,695 | A | 1/1998 | Manteghi |
| 5,753,971 | A | 5/1998 | Miller et al. |

(Continued)

FOREIGN PATENT DOCUMENTS

| JP | 409017910 | 1/1997 |
| JP | 410189827 | 7/1998 |
| JP | 02001110957 | 4/2001 |

*Primary Examiner*—Roy Karl Potter
(74) *Attorney, Agent, or Firm*—Townsend and Townsend and Crew LLP

(57) ABSTRACT

A power module package is provided. The power module package includes a power circuit element, a control circuit element, a lead frame, a heat sink, and an epoxy molding compound (EMC). The control circuit element is connected to the power circuit and controls chips in the power circuit. The lead frame has external connecting means formed at the edges thereof, and a down set part, namely, formed between the external connecting means. The lead frame has a first surface to which the power circuit and the control circuit are attached, and a second surface used as a heat dissipating path, in particular, the power circuit is attached to the down set part. The heat sink which is closely attached to the down set part of the second surface of the lead frame by an adhesive. The EMC surrounds the power circuit, the control circuit, the lead frame and the heat sink, and exposes the external connecting means of the lead frame and a side of the heat sink.

11 Claims, 7 Drawing Sheets

U.S. PATENT DOCUMENTS

| | | |
|---|---|---|
| 5,767,573 A | 6/1998 | Noda et al. |
| 5,814,878 A | 9/1998 | Hirakawa et al. |
| 6,291,265 B1 | 9/2001 | Mess |
| 6,291,880 B1 | 9/2001 | Ogawa et al. |
| 6,313,520 B1 * | 11/2001 | Yoshida et al. ............. 257/676 |
| 6,313,598 B1 | 11/2001 | Tamba et al. |
| 6,432,750 B2 | 8/2002 | Jeon et al. |
| 6,917,103 B2 * | 7/2005 | Hirano et al. ............... 257/707 |
| 2003/0011053 A1 | 1/2003 | Yasunaga |

* cited by examiner

POWER MODULE PACKAGE HAVING IMPROVED HEAT DISSIPATING CAPABILITY

CROSS-REFERENCE TO RELATED APPLICATIONS

This application is a Divisional application and claims priority from U.S. Patent Application Ser. No. 10/167,067 filed Jun. 10, 2002 now U.S. Pat. No. 7,061,080 entitled POWER MODULE PACKAGE HAVING IMPROVED HEAT DISSIPATING CAPABILITY which is hereby incorporated by reference, as if set forth in full in this document, for all purposes.

BACKGROUND OF THE INVENTION

1. Field of the Invention

The present invention relates to a semiconductor package, and more particularly, to a power module package having improved heat dissipating capability.

2. Description of the Related Art

In general, in semiconductor packages, one or more semiconductor chips is or are mounted on a chip pad in a lead frame, encapsulated with an epoxy molding compound (EMC) to protect internal parts, and mounted on a printed circuit board (PCB).

However, as high speed, large scale and highly integrated electronic devices have been rapidly developed in recent times, techniques that allow for low cost, miniaturization, and lightweight manufacturing are also required for power devices which are applied to automobiles, industrial equipment and household electrical appliances. Further, the power devices require high reliability and good temperature characteristics. Thus, a power module package for mounting a plurality of semiconductor chips on a semiconductor package is commonly used.

FIG. 1 is a sectional view of a conventional power module package, which is disclosed in U.S. Pat. No. 5,703,399, published on May 15, 1996, titled "Semiconductor Power Module".

Referring to FIG. 1, the power module package has a structure in which a plurality of semiconductor chips, including a power circuit 9 and a control circuit 8, are mounted on a lead frame 3. In the drawing, reference numerals 1, 2, and 4a denote a heat sink, an epoxy molding compound (EMC) having a high heat conductivity, and a power circuit chip, respectively. Also, reference numerals 5a, 5b, 6a, 6b, and 7 denote a control circuit chip, a resistance component, an aluminum wire, a gold wire, and an insulating EMC, respectively.

In the power module package having the above structure, the EMC 2 having high heat conductivity is used such that the heat sink 1 which is made of copper is slightly spaced apart from the lead frame 3. Thus, the EMC 2 and the heat sink 1 dissipate heat, which is generated in the power circuit chip 4a, to the outside of the power module package. However, the above-mentioned prior art has the following problems.

First, the EMC 2 is filled between the backside of the lead frame 3 and the heat sink 1 made of copper in order to maintain insulation properties, and thus there is a limitation in completely dissipating heat generated in the power circuit chip 4a, to the outside of the power module package. Second, two EMCs having different characteristics are used in one power module package, and thus a process of manufacturing the power module package becomes complicated and it is difficult to perform the process of manufacturing the power module package automatically. Third, the heat sink 1 made of copper is used in the power module package, and a process of manufacturing the power module package is complicated, and thus a manufacturing cost is increased.

SUMMARY OF THE INVENTION

To solve the above problems, it is an object of the present invention to provide a power module package which more effectively dissipates heat generated in a power circuit chip and is simpler and cheaper to manufacture.

Accordingly, to achieve the above object, according to an embodiment of the present invention, there is provided a power module package. The power module package includes a power circuit, a control circuit which is connected to the power circuit and controls chips in the power circuit, a lead frame having external connecting means at the edges thereof, a down set part, namely, downwardly facing concave portion, formed between the external connecting means, a first surface to which the power circuit and the control circuit are attached, and a second surface used as a heat dissipating path, wherein the power circuit is attached to the down set part, a heat sink which is closely attached to the down set part of the second surface of the lead frame by an adhesive, and an epoxy molding compound (EMC) for surrounding the power circuit, the control circuit, the lead frame and the heat sink, and for exposing the external connecting means of the lead frame and a side of the heat sink.

It is preferable that the power circuit includes power circuit chips and an aluminum wire for connecting the power circuit chips to the lead frame, and the aluminum wire has the diameter of 250–500 μm.

It is also preferable that the control circuit includes control circuit chips and a gold wire for connecting the control circuit chips to the lead frame.

It is also preferable that the adhesive for attaching the lead frame to the heat sink is a high temperature tape, and the high temperature tape is formed of a material selected from the group consisting of alumina ($Al_2O_3$), aluminum nitride (AlN), silicon oxide ($SiO_2$), and beryllium oxide (BeO), and the high temperature tape has a thickness of 10–20 μm. The high temperature tape can comprise particles including such thermally conductive materials embedded in a medium such as a polymer medium.

It is also preferable that the adhesive for attaching the lead frame to the heat sink is high temperature solder, and the high temperature solder is formed of a metal material selected from Pb/Sn, Sn/Ag, and Pb/Sn/Ag.

It is also preferable that the adhesive for attaching the lead frame to the heat sink is high thermal liquid epoxy, and the thickness of the high thermal liquid epoxy is 3–7 μm.

It is also preferable that the heat sink is made of plastic or ceramic, and the heat sink made of plastic or ceramic is formed of a material selected from the group consisting of alumina ($Al_2O_3$), aluminum nitride (AlN), silicon oxide ($SiO_2$), and beryllium oxide (BeO), and the heat sink made of plastic or ceramic has a thickness of 1–3 mm.

In order to achieve the above object, according to another embodiment of the present invention, there is provided a power module package. The power module package includes a direct bonding copper (DBC) substrate, a power circuit which is attached to the DBC substrate, a lead frame which is connected to one end of the DBC substrate, a control circuit which is attached to the lead frame, a wire for electrically connecting the power circuit and the control circuit to the lead frame, and an epoxy molding compound (EMC) for exposing only the back side of the DBC substrate and part of the lead frame and completely sealing the other portions of the DBC substrate and the lead frame.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, preferred embodiments of the present invention will be described in detail with reference to the accompanying drawings.

The arrangement of a power circuit element and a control circuit element which will be described in this specification, and the structure of a lead frame and a heat sink are exemplified, however, this invention is not limited to only the specific shapes shown in drawings and is self-evident to a person skilled in the art.

Figure 1:
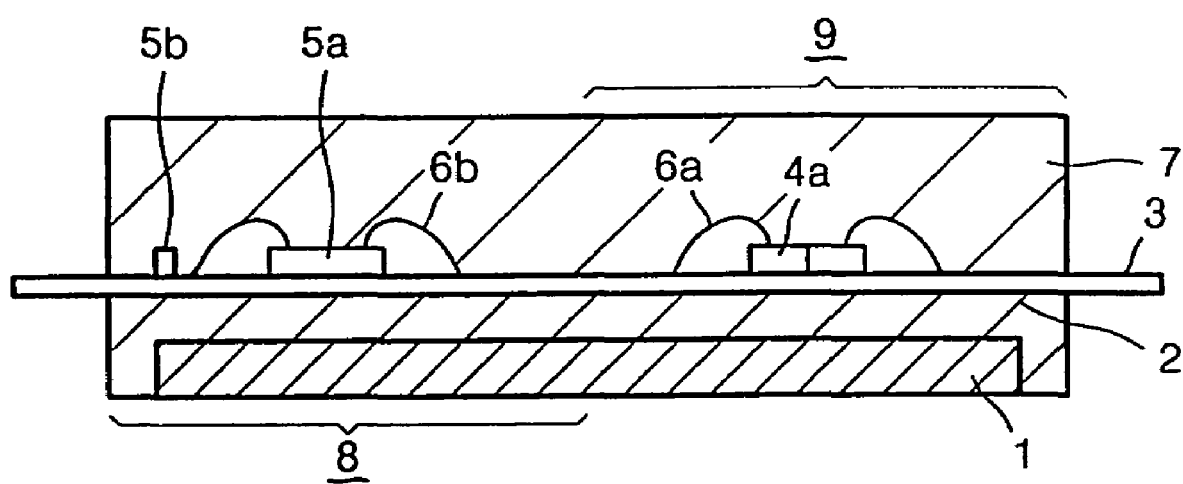
FIG. 1 is a sectional view illustrating an example of a conventional power module package.
Figure 2:
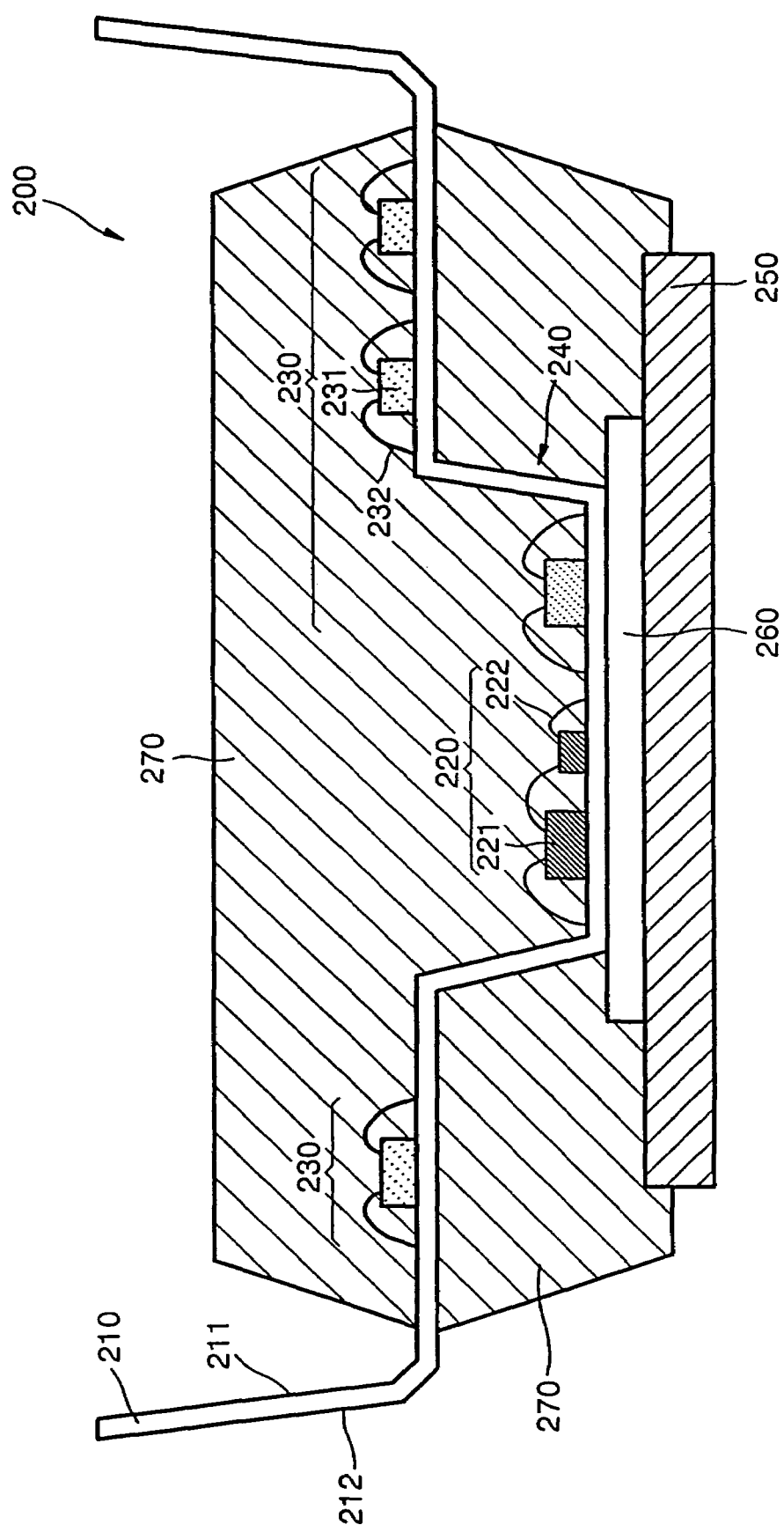
FIG. 2 is a sectional view of a power module package according to an embodiment of the present invention.

FIG. 2 is a sectional view of a power module package according to an embodiment of the present invention. Referring to FIG. 2, the power module package 200 includes a lead frame 210, a power circuit element 220, a control circuit element 230, a heat sink 250, and an epoxy molding compound (EMC) 270. The power circuit element 220 includes a power circuit chip 221 and an aluminum wire 222. The aluminum wire 222 has a diameter of about 250–500 µm such that the aluminum wire 222 can withstand a high current rating. The control circuit element 230 includes a control circuit chip 231 and a gold wire 232. The aluminum wire 222 and the gold wire 232 connect the power circuit chip 221 to the control circuit chip 231.

The lead frame 210 has a first surface 211 onto which circuit elements are attached and a second surface 212 which is opposite to the first surface 211, and a down set part 240, namely, a downwardly facing concave portion, is formed in the middle of the lead frame 210. The down set part 240 may be exactly placed in the center so that both sides thereof are symmetrical, but may be formed to be off to one side. The power circuit element 220 and the control circuit element 230 are attached to the first surface 211 of the lead frame 210. In particular, the power circuit element 220, which generates a large amount of heat, is attached to the first surface 211 of the down set part 240 of the lead frame 210.

The heat sink 250 is attached to the second surface 212 of the down set part 240 of the lead frame 210 by a high temperature tape 260, and a side of the heat sink 250 is completely exposed to the outside of the power module package 200. As occasion demands, high temperature solder can be used instead of the high temperature tape. Preferably, the solder is formed of a metal material selected from Pb/Sn, Sn/Ag, and Pb/Sn/Ag.

The heat sink 250 has a thickness of about 1–3 mm and can be manufactured by using a material selected from the group consisting of alumina ($Al_2O_3$), aluminum nitride (AlN), silicon oxide ($SiO_2$), and beryllium oxide (BeO). For example, a heat sink 250 made of ceramic can be manufactured by adding a material from the group consisting of alumina ($Al_2O_3$), aluminum nitride (AlN), silicon oxide ($SiO_2$), and beryllium oxide (BeO) to a filling material including ceramic. Also, a heat sink 250 made of plastic can be manufactured by adding a material from the group consisting of alumina ($Al_2O_3$), aluminum nitride (AlN), silicon oxide ($SiO_2$), and beryllium oxide (BeO) to a filling material including plastic. Meanwhile, if solder is used instead of the high temperature tape, metal is formed on a side of the heat sink 250 to be attached to the lead frame 210. Similarly, the high temperature tape 260 can be manufactured by using a material from the group consisting of alumina ($Al_2O_3$), aluminum nitride (AlN), silicon oxide ($SiO_2$), and beryllium oxide (BeO) and has a thickness of about 10–20 µm such that the lead frame 210 and the heat sink 250 are completely attached to each other.

According to the power module package having the above structure, the heat dissipating effect is increased because there is no space between the down set part 240 of the lead frame 210 and the heat sink 250.

Figure 5:
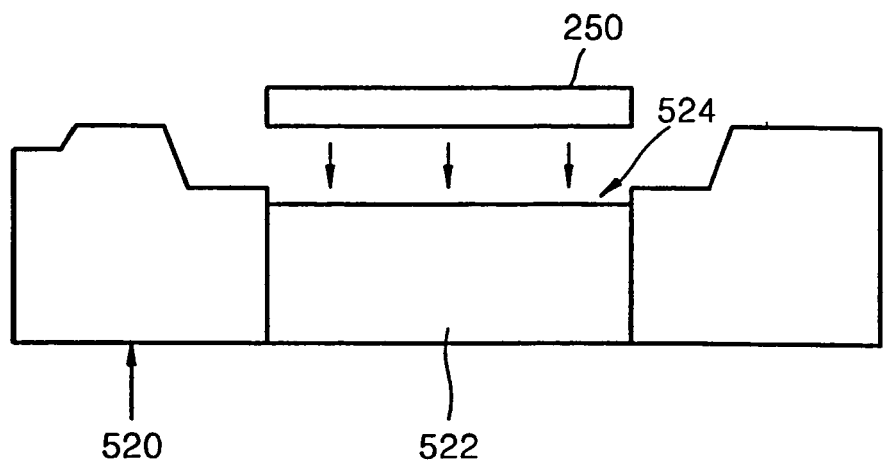
FIG. 5 is a sectional view of the structure of a bottom mold die of a molding equipment used in a method for manufacturing the power module package according to the present invention.
Figure 6:
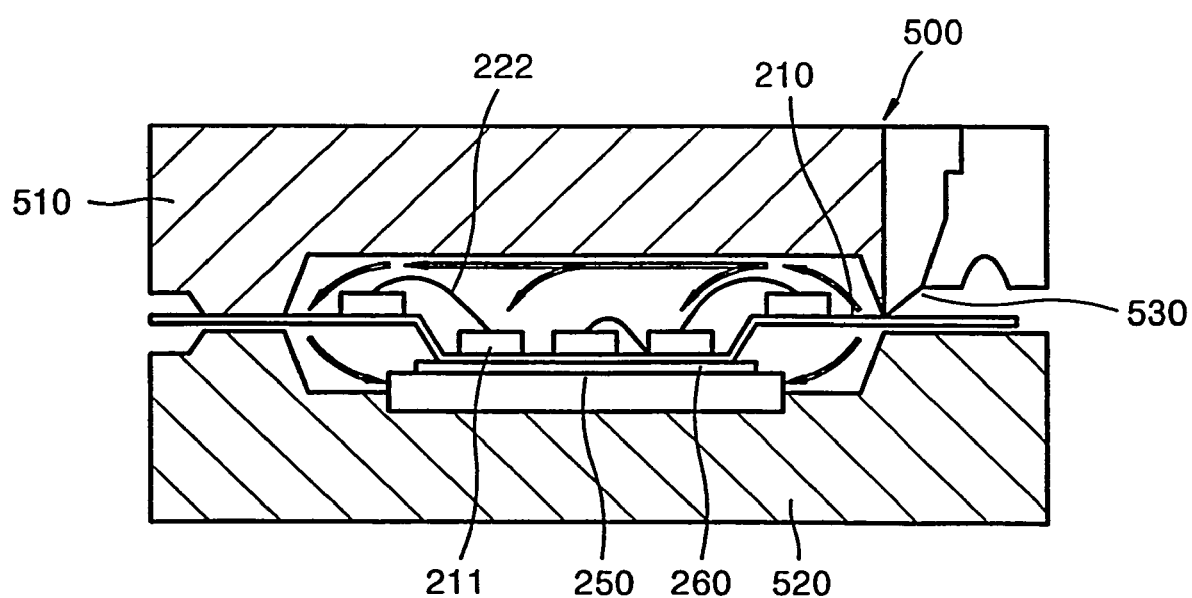
FIG. 6 is a sectional view illustrating a sealing process of the method for manufacturing the power module package according to the present invention.

FIGS. 5 and 6 illustrate a method for manufacturing the power module package according to an embodiment of the present invention. Specifically, FIG. 5 is a sectional view of the structure of a bottom mold die of a molding apparatus used in a method for manufacturing the power module package according to the present invention, and FIG. 6 is a sectional view illustrating a sealing process of the method for manufacturing the power module package according to the present invention.

Referring to FIGS. 2, 5 and 6, first, the lead frame 210 having the down set part 240 formed in the middle thereof is prepared. The power circuit chip 221 and the control circuit chip 231 are attached to the first surface 211 of the lead frame 210 by performing a die attach process. The power circuit chip 221 is attached to part of the down set part 240 of the lead frame 210. Next, a wire bonding process is performed, thereby properly connecting the power circuit chip 221 to the control circuit chip 231. The gold wire 232 is used as a wire for the control circuit chip chip 231, and the aluminum wire 222 is used as a wire for the power circuit chip 221. Preferably, the aluminum wire 222 has a diameter of about 250–500 µm such that the aluminum wire 222 can withstand a high current rating. Bonding methods such as a wedge bonding method and a ball bonding method, are used in performing the wire bonding process. In order to perform the wire bonding process smoothly, it is preferable that the aluminum wire 232 is first bonded and then the gold wire 222 is bonded.

Next, the heat sink 250 is fixed in a groove 524 which is formed on a heat sink block 522 of the bottom mold die (520 of FIG. 5). The heat sink 250 has a thickness of about 1–3 mm and can be manufactured by using a material selected from the group consisting of alumina ($Al_2O_3$), aluminum nitride (AlN), silicon oxide ($SiO_2$), and beryllium oxide (BeO). For example, the heat sink made of ceramic can be manufactured by adding a material from the group consisting of alumina ($Al_2O_3$), aluminum nitride (AlN), silicon oxide ($SiO_2$), and beryllium oxide (BeO) to a filling material including ceramic. Also, the heat sink 250 made of plastic can be manufactured by adding a material from the group consisting of alumina ($Al_2O_3$), aluminum nitride (AlN), silicon oxide ($SiO_2$), and beryllium oxide (BeO) to a filling material including plastic.

Next, after the wire bonding process, the lead frame 210 is placed in a molding apparatus. Here, the heat sink 250 has already been fixed in the groove 524 of the bottom mold die 520. Subsequently, the high temperature tape 260 is melted such that the heat sink 250 is completely attached to the second surface 212 of the down set part 240 of the lead frame 210. Here, the temperature and pressure for melting the high temperature tape 260 are about 160–220° C. and about 30 kg/cm², respectively. The high temperature tape 260 can be manufactured by using a material selected from the group consisting of alumina ($Al_2O_3$), aluminum nitride (AlN), silicon oxide ($SiO_2$), and beryllium oxide (BeO) and has a thickness of about 10–20 μm.

Next, a top mold die 510 is lowered, and the EMC 270 is flowed into an EMC apparatus through a gate 530. The EMC 270 is changed into a liquid by heat and pressure. Thus, the EMC 270 flows in a direction indicated by the arrows and fills the inside of a mold 500 uniformly. A transfer molding equipment including a plurality of gates and runners is used as the molding equipment, and preferably, the temperature for a sealing process is about 160–170° C.

Next, the lead frame after the sealing process, that is, the power module package 500, is unloaded from the molding apparatus, then the heat sink 250 is completely attached to the second surface 212 of the down set part 240 of the lead frame 210 by using the high temperature tape 260. Subsequently, subsequent processes such as a trim process and a forming process are performed.

Figure 3:
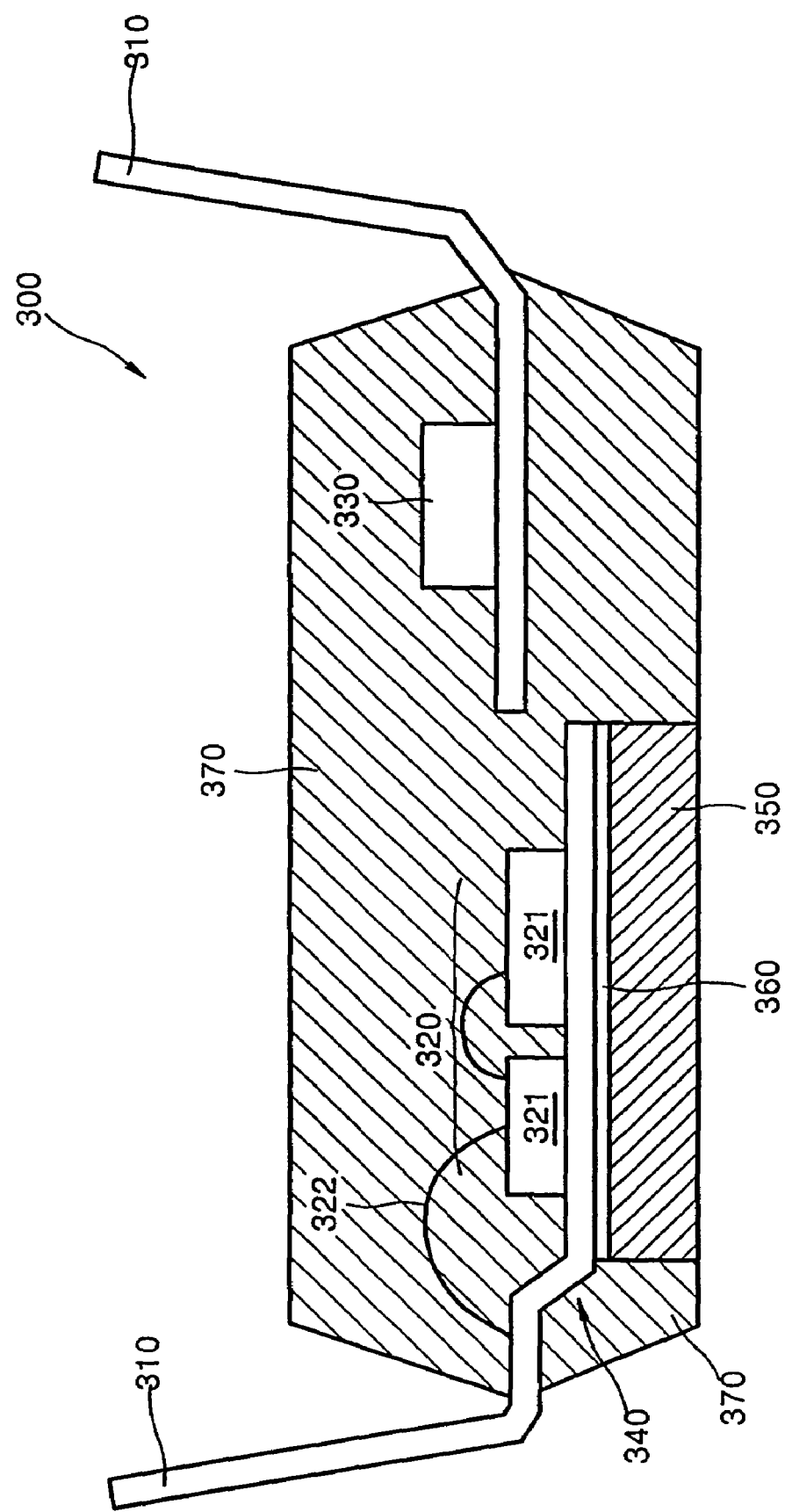
FIG. 3 is a sectional view of a power module package according to another embodiment of the present invention.

FIG. 3 is a sectional view of a power module package according to another embodiment of the present invention. Referring to FIG. 3, the power module package 300 includes a lead frame 310, a power device 320, a control device 330, a heat sink 350, and an epoxy molding compound (EMC) 370. The power device 320 includes a power circuit chip 321 and an aluminum wire 322. The control device includes a control circuit chip 330 and a gold wire (not shown). The lead frame 310 has a thickness of about 0.5–1.0 mm and includes a down set part 340 that is formed in the middle of the lead frame 310. The power device 320 and the control device 330 are attached to one surface of the lead frame 310. In particular, the power device 320, which generates a large amount of heat, is attached to the down set part 340 of the lead frame 310.

The heat sink 350 is attached to the opposite surface of the down set part 340 of the lead frame 310 using high thermal liquid epoxy 360, and a side of the heat sink 350 is completely exposed to the outside of the power module package 300. The high thermal liquid epoxy 360 can be made by adding a filling material including a material from the group consisting of alumina ($Al_2O_3$), aluminum nitride (AlN), silicon oxide ($SiO_2$), and beryllium oxide (BeO) to epoxy. The thickness of the high thermal liquid epoxy 360 is about 3–7 μm and represents thermal resistance less than about 1.5° C./W, and thus has improved thermal conductivity in comparison with a conventional power module package in which epoxy molding compounds are used.

FIGS. 7A through 7D are sectional views illustrating the method for manufacturing the power module package according to another embodiment of the present invention. First, referring to FIG. 7A, the lead frame 310 having a thickness of about 0.5–1.0 mm is prepared. The power circuit chip 321 and the control circuit chip 330 are attached to the surface of the lead frame 310 by performing a die attach process. The power circuit chip 321 is attached to part of the down set part 340 of the lead frame 310. The die attach process may be performed using solder or silver (Ag) epoxy as an adhesive. In a case where the die attach process is performed using solder as an adhesive, the temperature and pressure for the die attach process is about 350–380° C. and about 3–5 kg/cm², respectively, and the die attach process is performed in a hydrogen atmosphere. In a case where the die attach process is performed using Ag epoxy as an adhesive, the die attach process is performed at the room temperature and pressure under about 1–2 kg/cm².

Figure 7A:
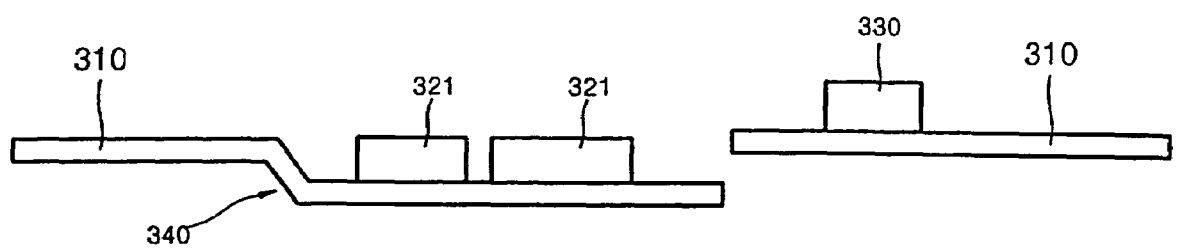
FIGS. 7A through 7D are sectional views illustrating the method for manufacturing the power module package according to another embodiment of the present invention.
Figure 7B:

Next, referring to FIG. 7B, the high thermal liquid epoxy 360 is attached to the upper surface of the heat sink 350 made of ceramic having a thickness of about 1–3 mm. The high thermal liquid epoxy 360 can be made by adding a filling material including a material from the group consisting of alumina ($Al_2O_3$), aluminum nitride (AlN), silicon oxide ($SiO_2$), and beryllium oxide (BeO) to epoxy.

Figure 7C:
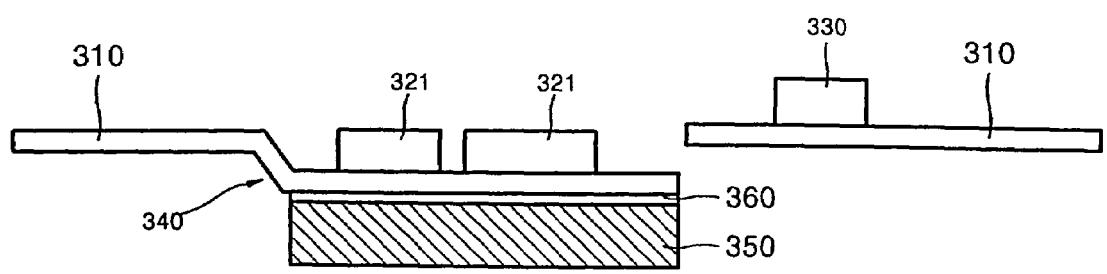

Next, referring to FIG. 7C, the heat sink 350 made of ceramic is attached to the lead frame 310 onto which the power circuit chip 321 is attached, using the high thermal liquid epoxy 360 as an adhesive. The attach process is performed at a temperature of about 150–180° C. and pressure under about 0.5–1.0 kg/cm² for about 3–5 minutes.

Figure 7D:
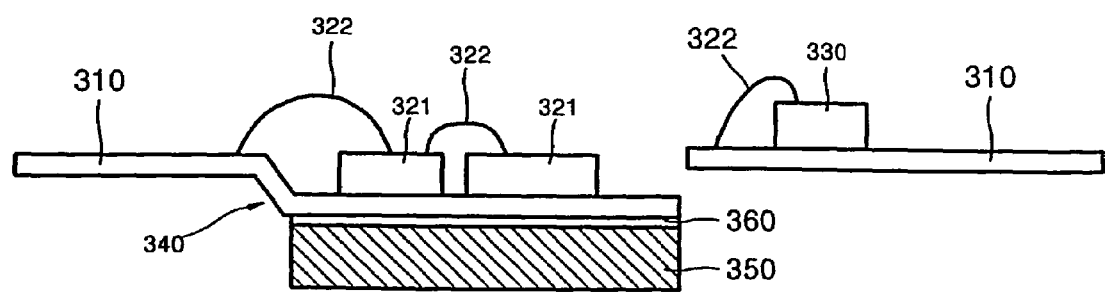

Next, referring to FIG. 7D, an aluminum wire bonding process or gold wire bonding process is performed, thereby electrically connecting the power circuit chip 321 to the lead frame 310, the power circuit chips 321 to each other and the control circuit chip 330 to the lead frame 310. Wires 322 including gold wires and aluminum wires. The gold wire is used as a wire for the control circuit chip 330, and aluminum wires are used as wire for the power circuit chips 321. The aluminum wire bonding process is performed by wedge bonding, and the gold wire bonding process is performed by ball bonding.

Next, as shown in FIG. 3, an encapsulation process is performed such that only the lower surface of the heat sink 350 made of ceramic and the end part of the lead frame 310 are exposed by the EMC 370, and then, general trim and forming processes are performed.

Figure 4:
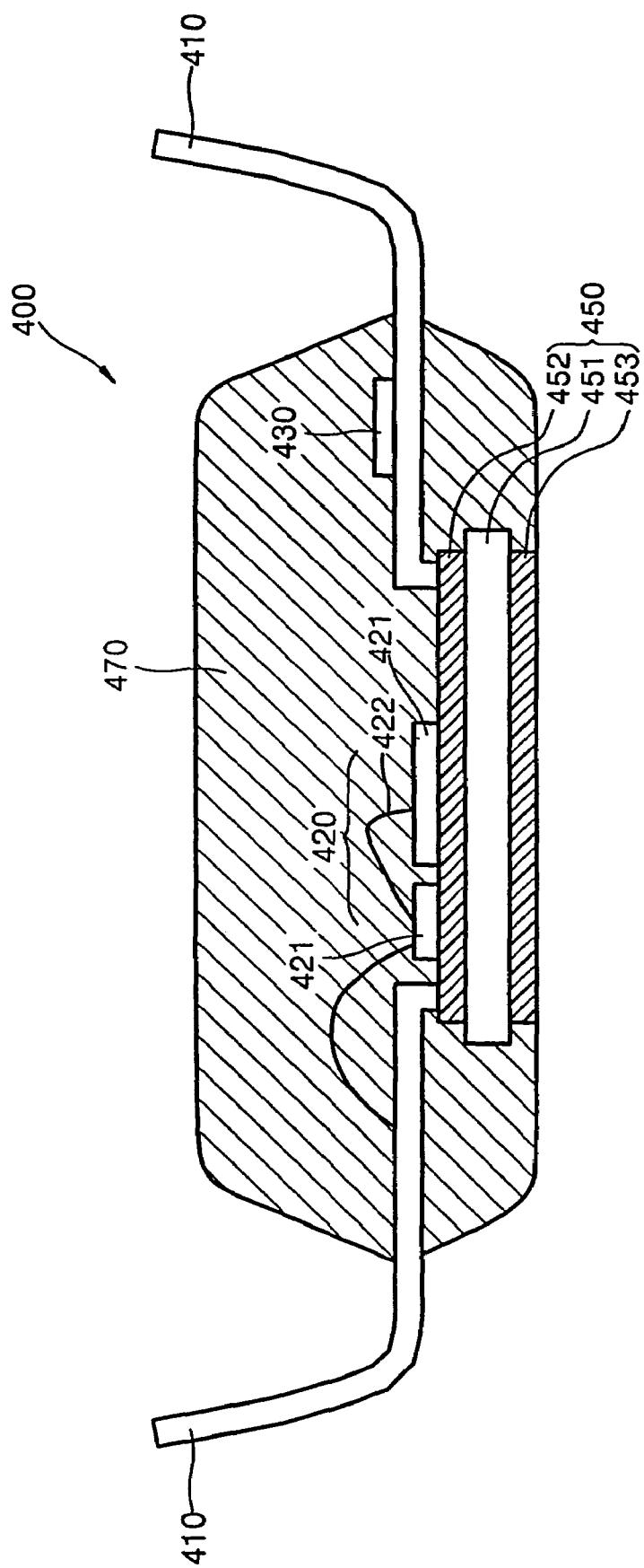
FIG. 4 is a sectional view of a power module package according to still another embodiment of the present invention.

FIG. 4 is a sectional view of a power module package according to still another embodiment of the present invention. The power module package according to the present embodiment is different from the power module packages according to the previous embodiments in which a heat sink is used, in that a direct bonding copper (DBC) substrate is used in the power module package according to the present embodiment.

Referring to FIG. 4, the power module package 400 includes a lead frame 410, a power device 420, a control device 430, a DBC substrate 450, and an epoxy molding compound (EMC) 470. The power device 420 includes a power circuit chip 421 and an aluminum wire 422. The control device includes a control circuit chip 430 and a gold wire (not shown). The DBC substrate 450 is comprised of central ceramic 451, an upper copper layer 452 attached to the upper surface of the ceramic 451, and a lower copper layer 453 attached to the lower surface of the ceramic 451. The power circuit chip 421 is attached to the surface of the upper copper layer 452 of the DBC substrate 450. The lead frame 410 is connected to the upper copper layer 452 of the DBC substrate 450. The control circuit chip 430 is attached to the lead frame 410.

A DBC substrate having higher thermal conductivity is used in the power module package 400, and thus the power module package 400 has improved heat dissipating capability.

In order to manufacture the power module package 400, first, the lead frame 410 is attached to the DBC substrate 450. The attach process may be performed using an adhesive such as solder or thermal tape, or by welding using a laser or spot, or by thermal compression using silver (Ag) or Ag/Sn plating. Next, the power circuit chip 421 and the control circuit chip 430 are attached to the lead frame 410. The die attach process may be performed using solder and Ag epoxy. The solder is used to attach the power circuit chip 421 to the lead frame 410, and in this case, the die attach process is performed at a temperature of about 330–360° C. The Ag epoxy is used to attach the control circuit chip 430 to the lead frame 410, and in this case, the die attach process is performed at the room temperature. Next, the power circuit chip 421 and the control circuit chip 430 are electrically connected to the lead frame 410 by performing a wire bonding process. An aluminum wire is used as a wire for the power circuit chip 421, and a gold wire is used as a wire for the control circuit chip 430. Next, an encapsulation process is performed using the EMC 470, and then, general trim and forming processes are performed.

As described above, the power module package and the method for manufacturing the same according the present invention have the following effects.

First, since the heat sink is directly attached to the back side of the down set part of the lead frame by using the high temperature tape, heat which is generated during operation of the power module package can be effectively dissipated, thereby increasing the reliability of the power module package. As an example, when the structure and material of the heat sink of the power module package are changed like those in the prevention invention, $R\Theta_{jc}$, as the thermal resistance of the conventional power module package was measured to be 0.19° C./Watt. On the other hand, $R\Theta_{jc}$ of the power module package according to the present invention was measured to be 0.15° C./Watt, and as a result, the heat dissipating capability is improved by 20–30%. For reference, $R\Theta_{jc}$ is an index representing a difference in temperature from the PN junction of the power circuit chip 121 to a case, as a mold line. Similarly, $R\Theta_{jc}$ was measured to be 0.15° C./Watt even in a case where the high thermal liquid epoxy instead of the high temperature tape is used.

Second, since the sealing process for the power module package is performed at a time by using the EMC having the same heat conductivity, it is advantageous to simplify and automatize processes.

Third, the power module package is manufactured by using the heat sink (not metal) at a low cost and the processes are simplified, thereby reducing the manufacturing cost of the power module package.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A power module package comprising:
    a direct bonding copper (DBC) substrate including a back side;
    a power circuit which is coupled to the DBC substrate;
    a lead frame with ends, which are coupled to one end of the DBC substrate;
    wherein the lead frame includes a first part, and a second downward facing part, and wherein the second downward facing part is coupled to the DBC substrate;
    a control circuit which is attached to the first part of the lead frame;
    a wire for electrically connecting the power circuit to the lead frame; and
    a molding compound exposing the backside of the DBC substrate and part of the lead frame and sealing the other portions of the DBC substrate and the lead frame,
    wherein the DBC substrate comprises an upper copper layer, a central ceramic layer, and a lower copper layer.

2. The power module package of claim 1 wherein the power circuit comprises a power circuit chip and wherein the control circuit comprises a control device.

3. The power module package of claim 1 wherein the wire is a first wire and wherein the power module package further comprises a second wire coupling the control circuit to the lead frame.

4. The power module package of claim 1 wherein the second part of the lead frame is perpendicular to the first part.

5. The power module package of claim 1 wherein the power circuit comprises a power circuit chip attached to a surface of the upper copper layer.

6. The power module package of claim 1, wherein the power circuit includes power circuit chips and an aluminum wire for connecting the power circuit chips to the lead frame.

7. The power module package of claim 1, wherein the control circuit includes control circuit chips and a gold wire for connecting the control circuit chips to the lead frame.

8. The power module package of claim 1, wherein the lead frame is attached to the DBC substrate with an adhesive.

9. The power module package of claim 8, wherein the adhesive comprises solder or thermal tape.

10. The power module package of claim 8, wherein the first part of the lead frame is attached to the DBC substrate by welding.

11. The power module package of claim 1, wherein the first part of the lead frame is attached to the DBC substrate by thermal compression.

* * * * *